(12) United States Patent  
Zhuang

(10) Patent No.: US 8,232,635 B2  
(45) Date of Patent: Jul. 31, 2012

(54) HERMETIC SEMICONDUCTOR PACKAGE

(75) Inventor: Weidong Zhuang, Worcester, MA (US)

(73) Assignee: International Rectifier Corporation, El Segundo, CA (US)

( * ) Notice: Subject to any disclaimer, the term of this patent is extended or adjusted under 35 U.S.C. 154(b) by 72 days.

(21) Appl. No.: 11/210,531

(22) Filed: Aug. 24, 2005

(65) Prior Publication Data

US 2006/0043550 A1    Mar. 2, 2006

Related U.S. Application Data

(60) Provisional application No. 60/604,472, filed on Aug. 25, 2004.

(51) Int. Cl.  
 *H01L 23/15* (2006.01)

(52) U.S. Cl. ........ 257/701; 257/703; 257/704; 257/705; 257/712; 257/778; 257/E23.193; 438/108

(58) Field of Classification Search .................. 257/778, 257/779, E23.193, E23.18, E23.128, 701, 257/703–705, 712; 438/108  
See application file for complete search history.

(56) References Cited

U.S. PATENT DOCUMENTS

| | | | | |
|---|---|---|---|---|
| 4,291,815 A * | 9/1981 | Gordon et al. | ................ | 220/200 |
| 4,649,416 A * | 3/1987 | Borkowski et al. | ........... | 257/728 |
| 4,742,182 A | 5/1988 | Fuchs | | |
| 4,853,491 A | 8/1989 | Butt | | |
| 4,870,224 A | 9/1989 | Smith et al. | | |
| 4,931,906 A | 6/1990 | Reifel et al. | | |
| 4,935,803 A * | 6/1990 | Kalfus et al. | ................ | 257/673 |
| 5,166,773 A * | 11/1992 | Temple et al. | ................ | 257/678 |
| 5,528,079 A | 6/1996 | McIver | | |
| 5,559,373 A | 9/1996 | Applebaum | | |
| 5,723,904 A * | 3/1998 | Shiga | ............................ | 257/698 |
| 5,904,499 A * | 5/1999 | Pace | .............................. | 438/108 |
| 6,057,612 A * | 5/2000 | Temple | ........................ | 307/150 |
| 6,388,264 B1 * | 5/2002 | Pace | .............................. | 250/551 |
| 6,639,313 B1 | 10/2003 | Martin et al. | | |
| 6,992,386 B2 * | 1/2006 | Hata et al. | ..................... | 257/735 |
| 2005/0161786 A1 | 7/2005 | Zhuang | | |
| 2005/0167789 A1 | 8/2005 | Zhuang | | |

FOREIGN PATENT DOCUMENTS

| EP | 0 235 503 | 1/1987 |
|---|---|---|
| EP | 1 560 266 A2 | 1/2005 |

* cited by examiner

*Primary Examiner* — Kenneth Parker  
*Assistant Examiner* — John Lin  
(74) *Attorney, Agent, or Firm* — Farjami & Farjami LLP

(57) ABSTRACT

A hermetically sealed semiconductor package that includes a power semiconductor die having electrodes thereof electrically connected to the external surface mountable terminals of the package without the use of wirebonds.

15 Claims, 3 Drawing Sheets

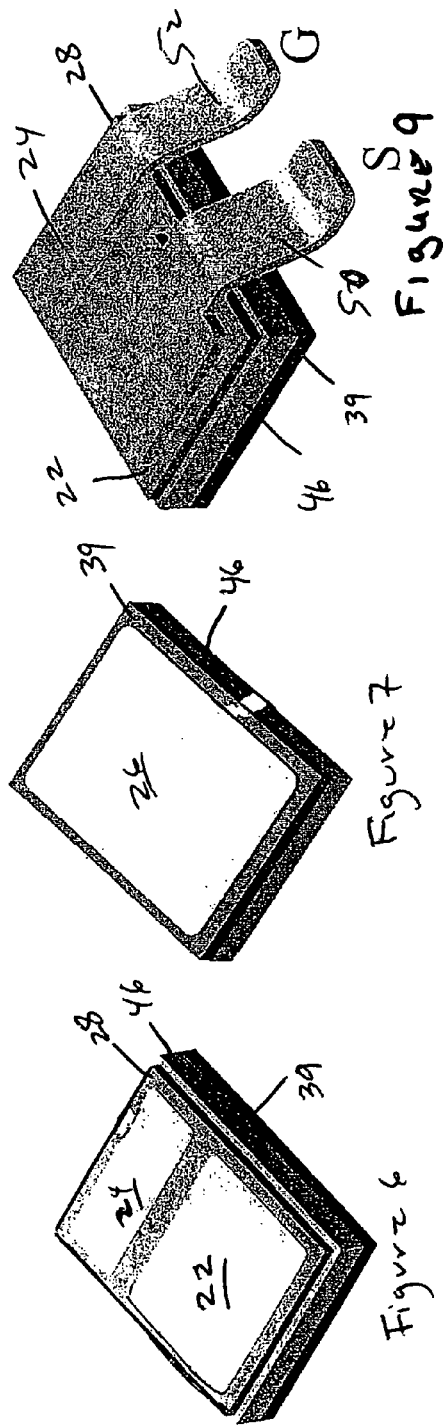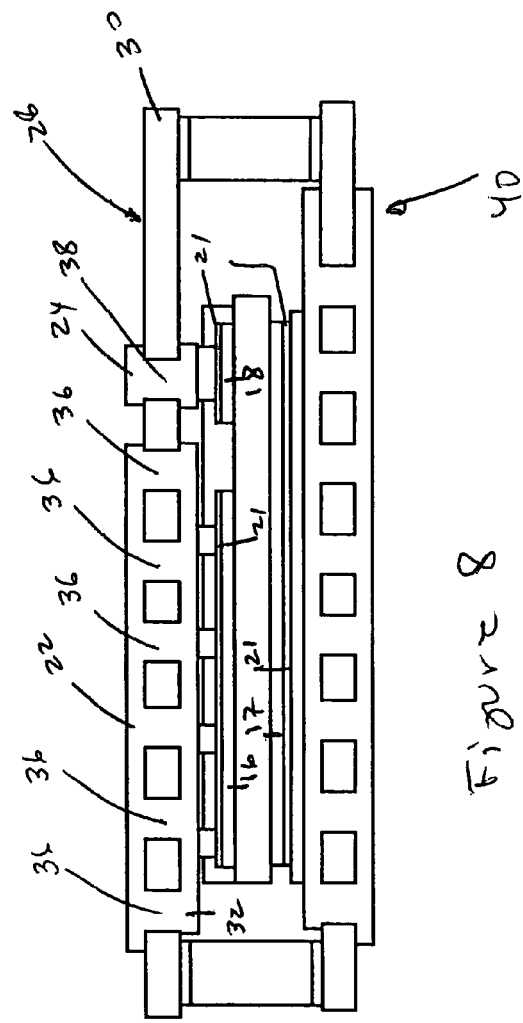

HERMETIC SEMICONDUCTOR PACKAGE

RELATED APPLICATION

This application is based on and claims benefit of U.S. Provisional Application No. 60/604,472, filed on Aug. 25, 2004, entitled Hermetic Chip Scale Packaging of Power MOSFETs and IGBTs, to which a claim of priority is hereby made and the disclosure of which is incorporated by reference.

BACKGROUND OF THE INVENTION

The present invention relates to power semiconductor packages, and more particularly to hermetically enclosed power semiconductor packages.

A high reliability semiconductor package typically includes a semiconductor device which is hermetically sealed in a housing portion thereof. Typical semiconductor devices used in high reliability semiconductor packages are power MOSFETs, bipolar transistors, Schottky diodes, PN junction diodes, and IGBTs.

Hermetic surface mount packages, leadless chip carriers and ceramic leadless chip carriers (also known as LCC and CLCC respectively) have served as high reliability platforms for more than 20 years.

In the recent years, a vast array of electronic designs have been integrating new surface mount packages (also referred to as surface mounted devices or SMDs) which have surface mountable terminals on a common surface thereof. Such SMDs are desirable due to their smaller size and footprint, lighter weight, and excellent thermal performance.

The following are some more advantages of such SMDs:

1) very low profile when compared to TO- and MO-types of packages;
2) light weight;
2) ideal for single MOSFET, IGBT and BJT die;
3) capable of dissipating very high power due to low thermal resistance from junction to case and employing low electrical resistance material for terminal design;
4) extremely reliable at package level and when used on CCA and CIC type of boards;
5) when used as building blocks for high reliability power modules, they can be pre-screened to give high yield at module level.

The following are some of the disadvantages of such SMDs:

1) thermal and reliability performance are largely nullified when they are used on organic printed circuit boards;
2) all connections are on the same plane which makes soldering, cleaning and inspection difficult;
3) problems with testing when multiple chips are packaged (e.g. synchronous rectifiers);
4) additional ceramic carriers are used to provide electrical isolation, stress relief to the leads, which may add many problems such as difficulty in inspection, significant increase of thermal resistance, and more cost;
5) cost is about four times higher than an ordinary TO-packages with comparable cavity size.

SUMMARY OF THE INVENTION

A package according to the present invention includes a power semiconductor die having power electrodes and the control electrode thereof electrically connected to external surface mountable terminals without wires, thus reducing the overall inductance and resistance of the package.

A hermetically sealed semiconductor package according to an embodiment of the present invention includes a power semiconductor die having at least a first power electrode and a control electrode, a substrate having a thermally conductive but electrically insulating body, at least one conductive pad on a first surface of the thermally conductive but electrically insulating body directly connected by a conductive adhesive body to the first power electrode, and at least another conductive pad on the first surface directly connected by a conductive adhesive body to the control electrode, at least a first external surface mountable terminal and a second external surface mountable terminal each being electrically connected to a respective one of the conductive pads, and a surround hermetically connected to the substrate and surrounding the power semiconductor die.

A package according to the present invention is advantageously capable of cooling from two opposing sides thereof (double-sided cooling), which allows for improved cooling of the junction temperature of the semiconductor device contained within the package.

Other features and advantages of the present invention will become apparent from the following description of the invention which refers to the accompanying drawings.

BRIEF DESCRIPTION OF THE DRAWINGS

FIG. 6 shows a top perspective view of a package according to the second embodiment of the present invention.

FIG. 7 shows a bottom perspective view of a package according to the second embodiment of the present invention.

FIG. 8 shows a cross-sectional view of a package according to the second embodiment along line 8-8 and seen in the direction of the arrows.

FIG. 9 shows a perspective view of a package according to the third embodiment of the present invention.

DETAILED DESCRIPTION OF THE FIGURES

Figure 1:
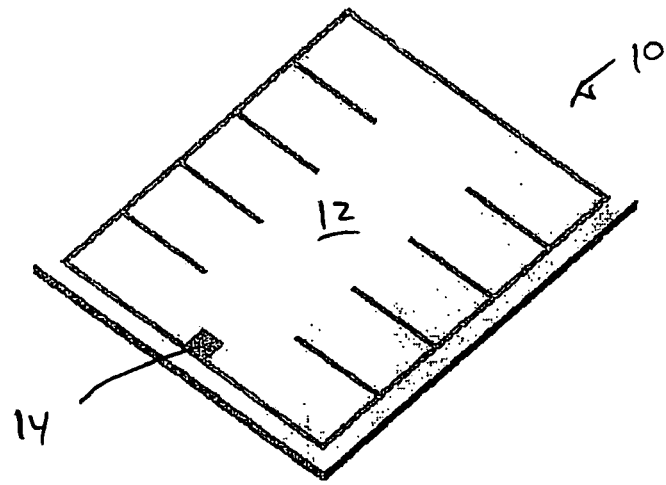
FIG. 1 schematically shows a perspective view of a power semiconductor die according to the prior art.

Referring to FIG. 1, a power MOSFET 10 according to the prior art includes source electrode 12 and gate electrode 14 both formed with an aluminum or aluminum alloy suitable for wirebonding.

Figure 2:
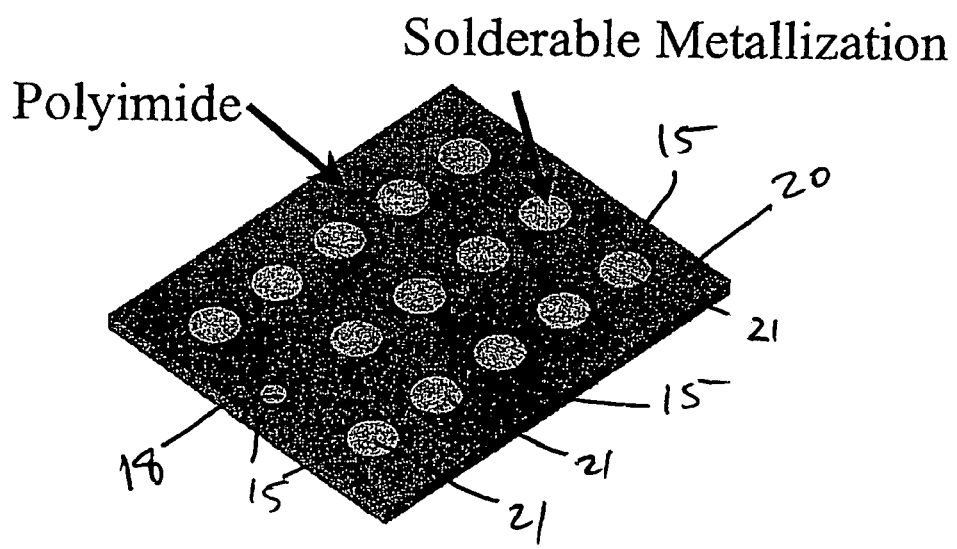
FIG. 2 schematically shows a perspective view of a power semiconductor die configured for wire free bonding.

Because wirebonds have a negative effect on the overall resistance and inductance of the package, it is desirable to eliminate wirebonds from the package. To eliminate wirebonds power MOSFETs have been developed with solderable source and gate electrodes. Referring to FIG. 2, a power MOSFET can be configured to have solderable surfaces 21 on the source electrode thereof exposed through openings 15 in a passivation layer 20, and a solderable surface 18 on the gate electrode thereof exposed through a respective opening 15 in passivation layer 20. Solderable surfaces 16, 18 allow for direct electrical connection with a conductive adhesive such as solder or the like to conductive pads of a circuit board thereby eliminating the need for wirebonding. Thus, the overall resistance and inductance of the package may be improved. Also, the footprint of the package may be reduced in that it becomes possible to devise a package nearly the size of the die itself.

Passivation layer 20 may be formed from a polymer such as polyimide, or the like, and can serve as passivation as well as solder resist to prevent the accidental shorting of the electrodes due to solder creepage during reflow.

Figure 3:
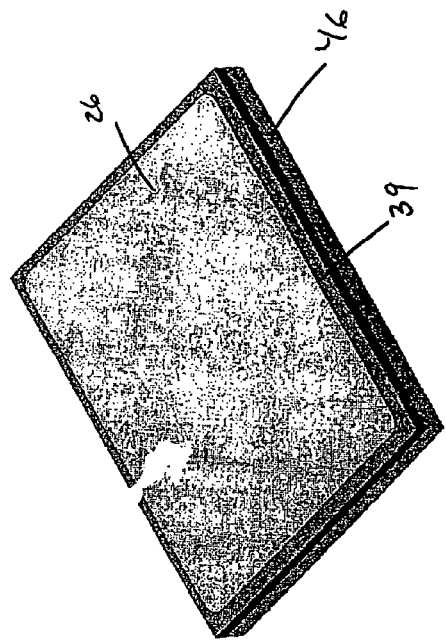
FIG. 3 shows a perspective view of the top of a package according to the first embodiment of the present invention.

Referring next to FIG. 3, a semiconductor package according to the first embodiment of the present invention includes a plurality of first surface mountable power terminals 22, and at least one surface mountable control terminal 24. Surface mountable terminals 22, 24 are configured for surface mounting onto conductive pads on a circuit board or the like, and constitute the external connections for the power device contained within the package. Specifically, surface mountable power terminals 22 serve as external connections for the first power electrode (e.g. source electrode) of the power semiconductor device, and surface mountable control terminal 24 serves as the external connection for the control electrode (gate electrode) of the power semiconductor device contained within the package.

Figure 4:
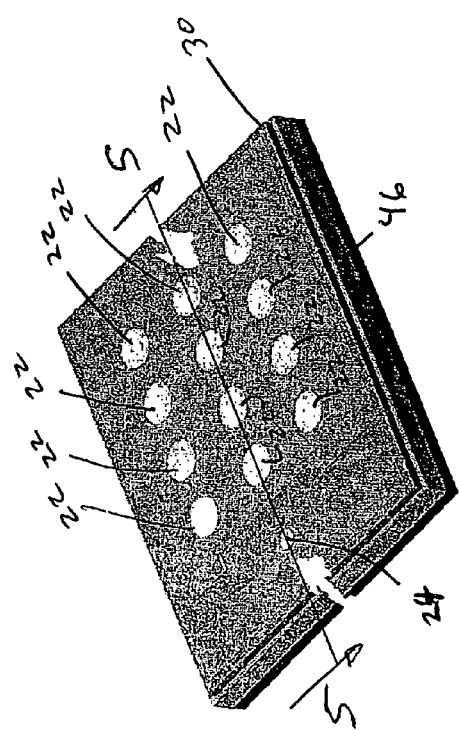
FIG. 4 shows a perspective view of the bottom of a package according to the first embodiment of the present invention.

Referring to FIG. 4, a package according to the first embodiment further includes second surface mountable power terminal 26, which serves as the external connection for the second surface mountable power terminal (e.g. drain electrode) of the semiconductor power device contained within the package.

Figure 5:
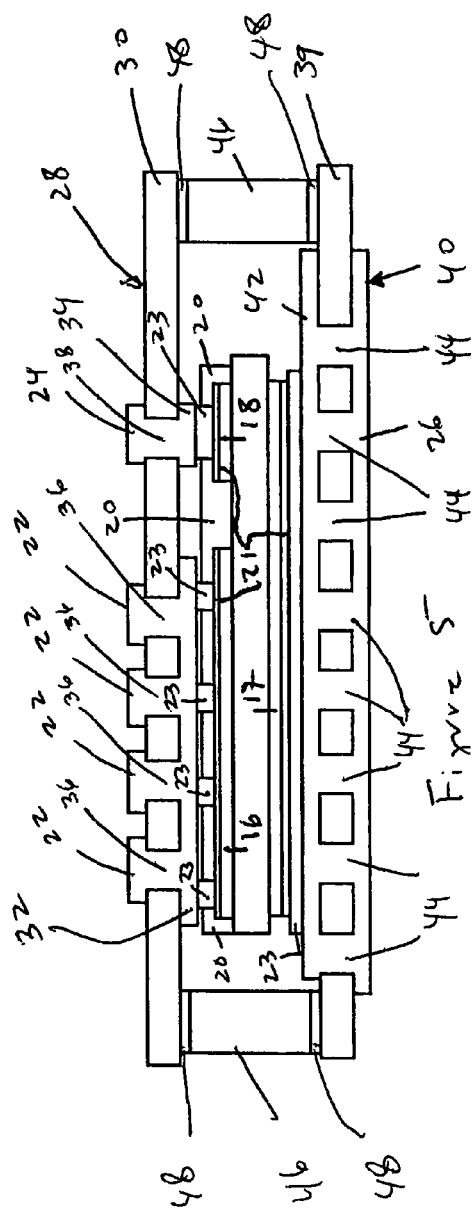
FIG. 5 shows a cross-sectional view of a package according to the first embodiment along line 5-5 and viewed in the direction of the arrows.

Referring next to FIG. 5, a package according to the first embodiment of the present invention includes a power semiconductor die (e.g. power MOSFET), such as the one shown in FIG. 2, having on one surface thereof a control electrode 18 (e.g. gate electrode), a first power electrode 16, and a passivation body 20, and on another, opposing surface thereof a second power electrode 17 (e.g. drain electrode).

First power electrode 16, control electrode 18, and second power electrode 17 each is preferably rendered solderable, or otherwise electrically attachable by a conductive adhesive, by a respective solderable body 21 disposed thereon. Solderable body 21 may be formed from a known trimetal stack such as Ti:Ni:Ag or any other known solderable combination used in semiconductor arts.

A package according to the present invention further includes first substrate 28 having a thermally conductive, but electrically insulating body 30, such a ceramic body, at least first conductive pad 32 disposed on the first surface of substrate 28 for electrical connection to first power electrode 16 of the power semiconductor device by a conductive adhesive body 23 and another conductive pad 34 on the first surface of substrate 28 electrically connected to control electrode 18 of the power semiconductor device by a conductive adhesive body 23.

Conductive pad 32 is electrically connected to first surface mountable power terminals 22 on the opposite surface of body 30 through conductive filled vias 36, and conductive pad 34 is electrically connected to surface mountable control terminal 24 on the opposite surface of body 30 through a respective conductive filled via 38.

A package according to the first embodiment further includes second substrate 40. Second substrate 40 includes a thermally conductive, but electrically insulating body 39 formed with, for example, a ceramic, and at least one conductive pad 42 on a first surface of body 39 electrically connected to second power electrode 17 of the power semiconductor device by a conductive adhesive body 23. Conductive pad 42 is electrically connected to second surface mountable power terminal 26 on the opposite surface of body 39 through at least one, but preferably a plurality of conductive filled vias 44.

In the preferred embodiment of the present invention, bodies 30, 39 are formed with a ceramic such as $Al_2O_3$, and conductive pads 32, 34, 42 and surface mountable terminals 22, 24, 26 are formed with a highly conductive metal such as copper. The filling in conductive filled vias 36, 38, 44 may be a same conductive material such as tungsten.

A package according to the present invention further includes surround 46 disposed around and surrounding the semiconductor device. Surround 46 is preferably formed from a ceramic material such as $Al_2O_3$ or the like and is hermetically attached to second substrate 40 to form an enclosure in which the semiconductor device is received. Furthermore, surround 46 is hermetically attached to first substrate 28 to hermetically seal the semiconductor device in an enclosed space. To hermetically attach surround 46 to first substrate 28 and second substrate 40 a hermetic seal 48 is used. Hermetic seal 48 is preferably formed with a gold/tin or gold/germanium alloy and is applied by brazing or the like.

Referring next to FIG. 6, a power semiconductor package according to the second embodiment of the present invention includes all of the features of the first embodiment, except that it includes only one surface mountable power terminal 22 (instead of a plurality of first surface mountable power terminals) electrically connected to conductive pad 32 through a plurality of conductive filled vias 36, and an enlarged surface mountable control terminal 24.

Referring next to FIG. 9, a package according to the third embodiment of the present invention includes a first conductive strap 50 electrically attached by a conductive adhesive such as solder or the like to first surface mountable power terminal 22, and second conductive strap 52 electrically connected by solder or the like to control surface mountable terminal 24. The free ends (unconnected ends) of straps 50, 52 are preferably coplanar with second surface mountable power terminal 26 whereby a package according to the third embodiment may be surface mounted onto laterally disposed conductive pads on a circuit board. Straps 50, 52 are made from a highly conductive metal such as copper or a copper alloy.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A hermetically sealed semiconductor package comprising:
    a power semiconductor die including at least a first power electrode, a control electrode and a second power electrode disposed opposite said first power electrode;
    a substrate having a thermally conductive but electrically insulating body, at least one conductive pad on a first surface of said thermally conductive but electrically insulating body connected by a conductive adhesive body to said first power electrode, and at least another conductive pad on said first surface connected by another conductive adhesive body to said control electrode;
    at least a first external terminal and a second external terminal each being electrically connected to a respective one of said conductive pads through a respective conductive filled via inside said substrate;

a thermally conductive but electrically insulating surround hermetically connected to said substrate and surrounding said power semiconductor die;

another substrate having a thermally conductive but electrically insulating body, and having a third conductive pad electrically connected to said second power electrode by a third conductive adhesive body, said another substrate being hermetically attached to said surround;

a third surface mountable terminal electrically connected to said third conductive pad through a conductive filled via inside said another substrate and disposed opposite said first and second external terminals;

said substrate, said another substrate, and said surround creating a hermetically sealed space providing double-sided cooling in both the vertical and lateral directions around said power semiconductor die, and wherein said first external terminal, said second external terminal, and said third surface mountable terminal are outside said hermetically sealed space.

2. The package of claim 1, wherein said thermally conductive but electrically insulating surround comprises a ceramic.

3. The package of claim 1, wherein said thermally conductive but electrically insulating surround is hermetically sealed to said substrate and said another substrate by a hermetic seal.

4. The package of claim 3, wherein said hermetic seal comprises a gold/tin alloy.

5. The package of claim 1, wherein said first power electrode and said control electrode each includes a solderable body disposed thereon.

6. The package of claim 1, wherein said conductive adhesive body is comprised of either solder, or a conductive epoxy.

7. The package of claim 1, wherein said thermally conductive but electrically insulating body is comprised of a ceramic.

8. The package of claim 7, wherein said ceramic is comprised of alumina.

9. The package of claim 1, wherein said power semiconductor die is a power MOSFET.

10. The package of claim 1, further comprising a dielectric body formed on said first power electrode and said control electrode, said dielectric body including at least one opening over said first power electrode and a second opening over said control electrode.

11. The package of claim 10, wherein said dielectric body includes a plurality of openings over said first power electrode.

12. The package of claim 10, wherein said dielectric body is comprised of a polymer.

13. The package of claim 10, wherein said dielectric body is comprised of polyimide.

14. The package of claim 10, wherein said dielectric is not wet by said conductive adhesive.

15. The package of claim 10, wherein said dielectric functions as a passivation.

* * * * *